United States Patent [19]

Morris

[11] Patent Number: 4,608,941

[45] Date of Patent: Sep. 2, 1986

[54] APPARATUS FOR SOLDERING PRINTED CIRCUIT PANELS

[75] Inventor: Gilbert V. Morris, Amherst, N.H.

[73] Assignee: Teledyne Electro-Mechanisms, Hudson, N.H.

[21] Appl. No.: 690,140

[22] Filed: Jan. 10, 1985

[51] Int. Cl.⁴ .............................................. H05K 3/22
[52] U.S. Cl. ..................................... 118/63; 118/404; 118/424; 427/96
[58] Field of Search ........................ 118/424, 404, 63; 427/96

[56] References Cited

U.S. PATENT DOCUMENTS

| 4,099,194 | 7/1978 | Kümmerl | 118/424 |
| 4,315,042 | 2/1982 | Spigarelli | |
| 4,360,144 | 11/1982 | Cuddy | 427/96 |
| 4,383,494 | 5/1983 | Schillke | 118/423 |
| 4,389,797 | 6/1983 | Spigarelli | 118/58 |
| 4,469,716 | 9/1984 | Caratsch | 427/96 |
| 4,563,974 | 1/1986 | Price | 118/404 |

FOREIGN PATENT DOCUMENTS 2856460  7/1980  Fed. Rep. of Germany ...... 118/424

*Primary Examiner*—John D. Smith
*Attorney, Agent, or Firm*—Brumbaugh, Graves, Donohue & Raymond

[57] ABSTRACT

Apparatus for soldering printed circuit panels includes a roll configuration to convey the panels horizontally across a container carrying molten solder. The printed circuit panels are immersed in molten solder when they pass through the roll configuration. At least one air knife located at the output side of the roll configuration serves to level the molten solder on the panels as they exit from the rolls.

11 Claims, 6 Drawing Figures

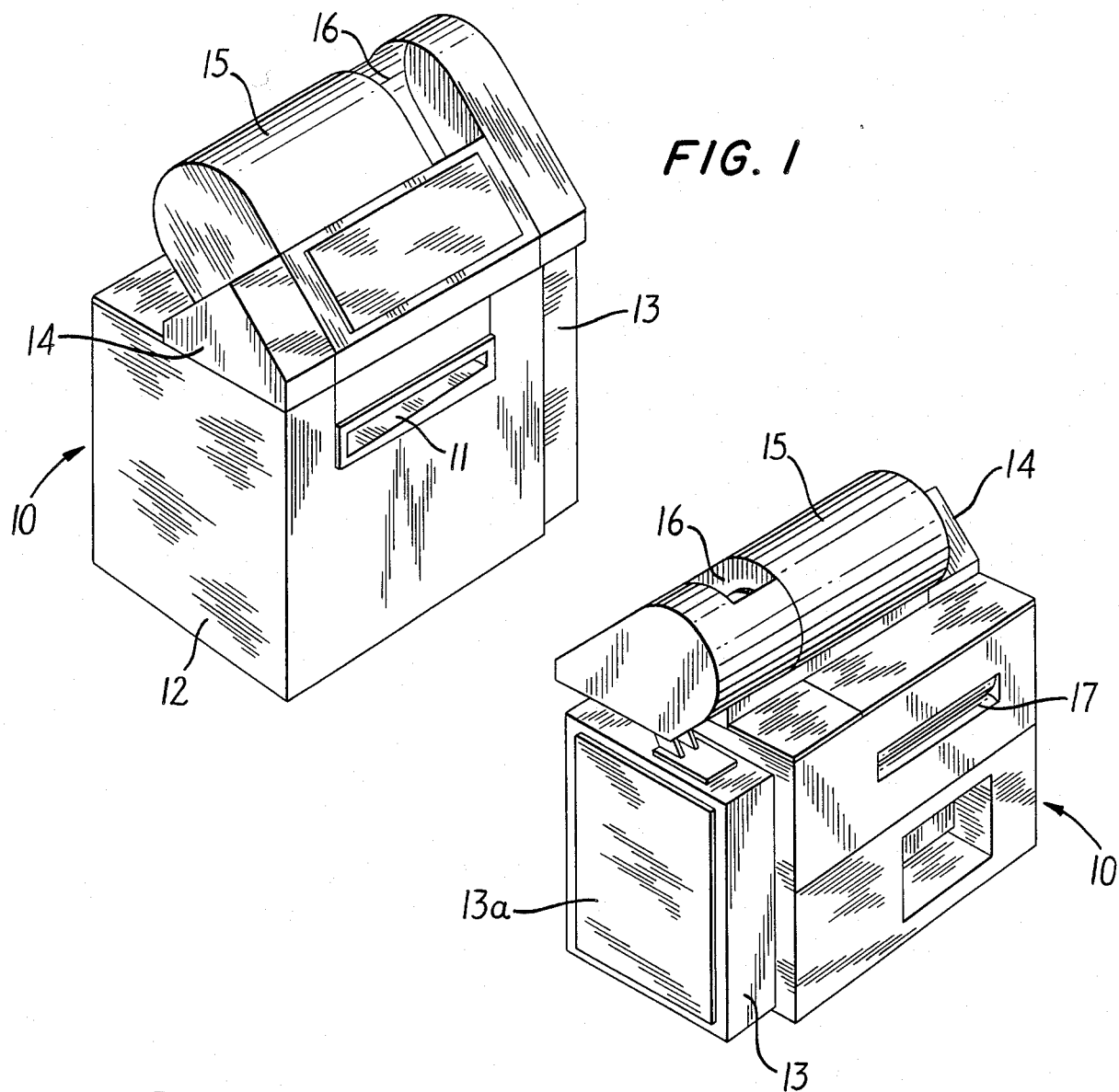
FIG. 1
FIG. 2
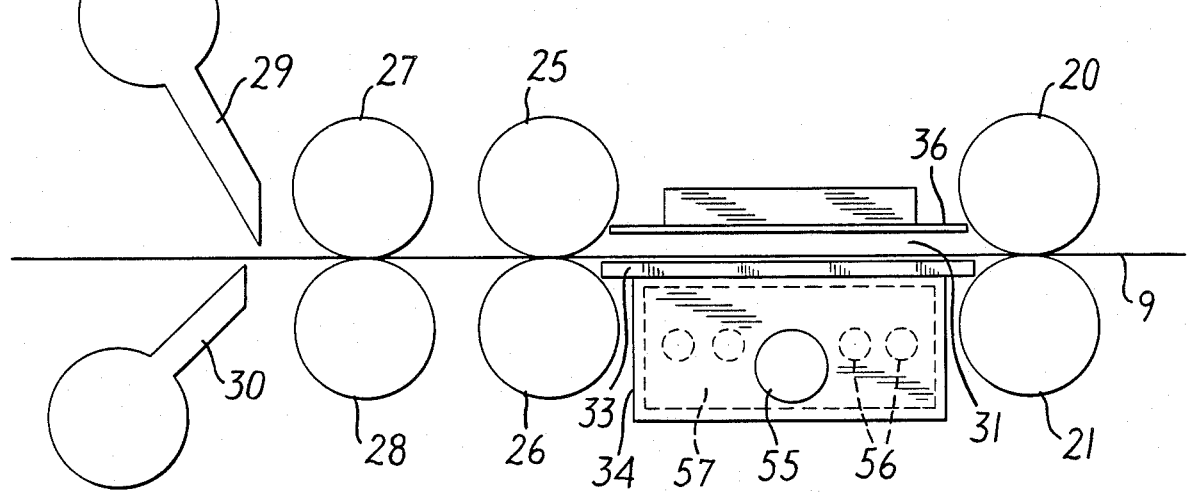
FIG. 4

APPARATUS FOR SOLDERING PRINTED CIRCUIT PANELS

BACKGROUND OF THE INVENTION

Printed circuits are formed with major dimensions of length and width and contain one or more circuits. The thickness of the printed circuit panels varies for many different reasons and directly effects panel flexibility.

For example, printed circuits made with multiple conductor planes use a bonded dielectric layer or layers for separation. Holes perforated through the circuit substrate serve a number of purposes including solder terminals for installation into another assembly, plated through hole interconnections between conductor planes, and tooling registration holes.

Exposed copper on the finished circuits must, with few exceptions, be solder coated, often termed presoldering. It is also preferable that the solder be applied only where needed later and not on all conductor runs. To apply solder selectively, a dielectric, referred to as a cover dielectric or solder mask, is used to cover copper that need not be solder coated. The desired copper portions remain exposed and are solder coated, at terminal pads and the like. In other words the only exposed copper on the surface of the printed circuit is solder coated.

It is also necessary that all holes through the printed circuit be lined with solder but unobstructed by solder when finished so as not to obstruct later insertion requirements. The process of clearing the holes of solder is referred to as leveling.

More particularly, printed circuit panels are presoldered, inter alia, to maintain solderability for subsequent operations. For economic purposes, such presoldering must be accomplished as a mass panel coating technique. Known solder coating techniques include electrolytic plating, and electrolytic plating followed by hot reflow. The hot reflow may be accomplished by the use of infrared reflow techniques, hot liquid reflow or hot vapor reflow. Another mass solder coating technique is hot roller coating. Finally, hot immersion dip and hot immersion dip followed by hot leveling are also known techniques. In the latter, leveling may be accomplished by hot liquid leveling, hot vapor leveling, or hot gas leveling.

The last technique described, immersion dip followed by hot leveling, has been found to be most effective for many printed circuit applications.

The machines presently available for selective solder coating and hot air leveling apply solder by vertically dipping panels into hot molten solder. Subjecting the panels to a hot air blast levels or removes excess solder and clears all holes as the panels are withdrawn from the liquid solder. With these machines, all operations must either be done manually or linked to an up-down and horizontal index mechanism. This precludes the continuous feed of panels, a process that is economically beneficial.

Moreover, solder coating in the presence of oxygen tends to be a dirty operation due to the formation of oxides. This complicates the mechanisms of transfer of the panels.

Another problem encountered with available soldering machines results from the nature of the materials used in printed circuits which, except for the metal conductors, are sensitive to heat and thermal shock. Precise control of time and temperature in processing operations thus becomes critical. Further, vertical dipping of the printed circuit panels into a solder bath requires that the first area into the hot solder is the last to leave. With the thin flexible substrates often used in printed circuits, rapid entry into the dense liquid solder causes bending and folding, and damages the panel and the effectiveness of subsequent hot air leveling. For these reasons, slow entry of the panels into the molten solder, use of special fixturing, and wide variations of time-temperature exposure across printed circuit panels, all undersirable, are encountered.

One technique of selectively soldering and leveling printed circuits is described in U.S. Pat. No. 4,315,042 for Solder Removal Technique. The process and apparatus there described are subject to many of the disadvantages discussed above. In particular, it is not possible to provide a continuous use of the process to render it efficient and economical.

Another technique of applying solder to printed circuits uses so-called wave soldering machines. The printed circuit is passed over the solder wave which results in the application of solder to one side of the printed circuit. This technique has the disadvantage of requiring two passes to solder both sides of many printed circuit configurations.

SUMMARY OF THE INVENTION

The present invention provides for selectively soldering and leveling printed circuit panels in a continuous manner. More particularly, a roll configuration is mounted to convey printed circuit panels horizontally across a container carrying molten solder. As the printed circuit panels are horizontally moved through the roll configuration, the panel is immersed in molten solder. At least one air knife located at the output side of the roll configuration serves to level the molten solder on the panel as it exits from the rolls.

In one embodiment of the invention, two pairs of rolls serve to convey the printed circuit panel through a solder conduit or channel formed between the two pairs of rolls and containing molten solder which flows therealong. A printed circuit is passed through the first pair of rolls, which acts as a barrier and boundary for one side of the solder containing channel, and then through the flowing solder. The printed circuit exits the solder through the second pair of rolls which forms another boundary for the flowing solder. Adjacent another pair of rolls, which serves to transport the printed circuit, is an air knife assembly to level the molten solder as the circuit panel exits the rolls.

The rolls are mounted to be urged apart by the printed circuit panels. This arrangement permits the passage of printed circuits having a wide variety of thicknesses through the roll configuration. In other words, thin flexible printed circuit panels and thicker and more rigid panels can be selectively soldered and leveled by the inventive method and apparatus.

In another embodiment of the invention, three pairs of rolls are used to horizontally transport flexible circuit panels capable of limited bending. In this embodiment, the three lower rolls are immersed in the molten solder and the three upper rolls protrude into the solder, are partially submerged and operate as followers.

Using the inventive method and apparatus, a wide variety of printed circuit panels can be rapidly and effectively simultaneously soldered on both sides. If desired, the process can readily be automated in the interests of efficiency and economy. Moreover, horizontally transporting the panels provides that the portion of the panel that enters the solder first also exits first. It is relatively simple to control the rate of the conveyance through the solder, to control the solder temperature, and also to control and remove the oxide contamination which inevitably occurs when the soldering process takes place in the presence of oxygen.

BRIEF DESCRIPTION OF THE DRAWINGS

FIG. 1 is a perspective front view of the inventive apparatus for soldering and leveling printed circuit panels;

FIG. 2 is a perspective rear view of the inventive apparatus shown in FIG. 1;

FIG. 4 is a view diagrammatically showing portions of the inventive apparatus of FIG. 3 from an end view;

DESCRIPTION OF EXEMPLARY EMBODIMENTS

Figure 3:
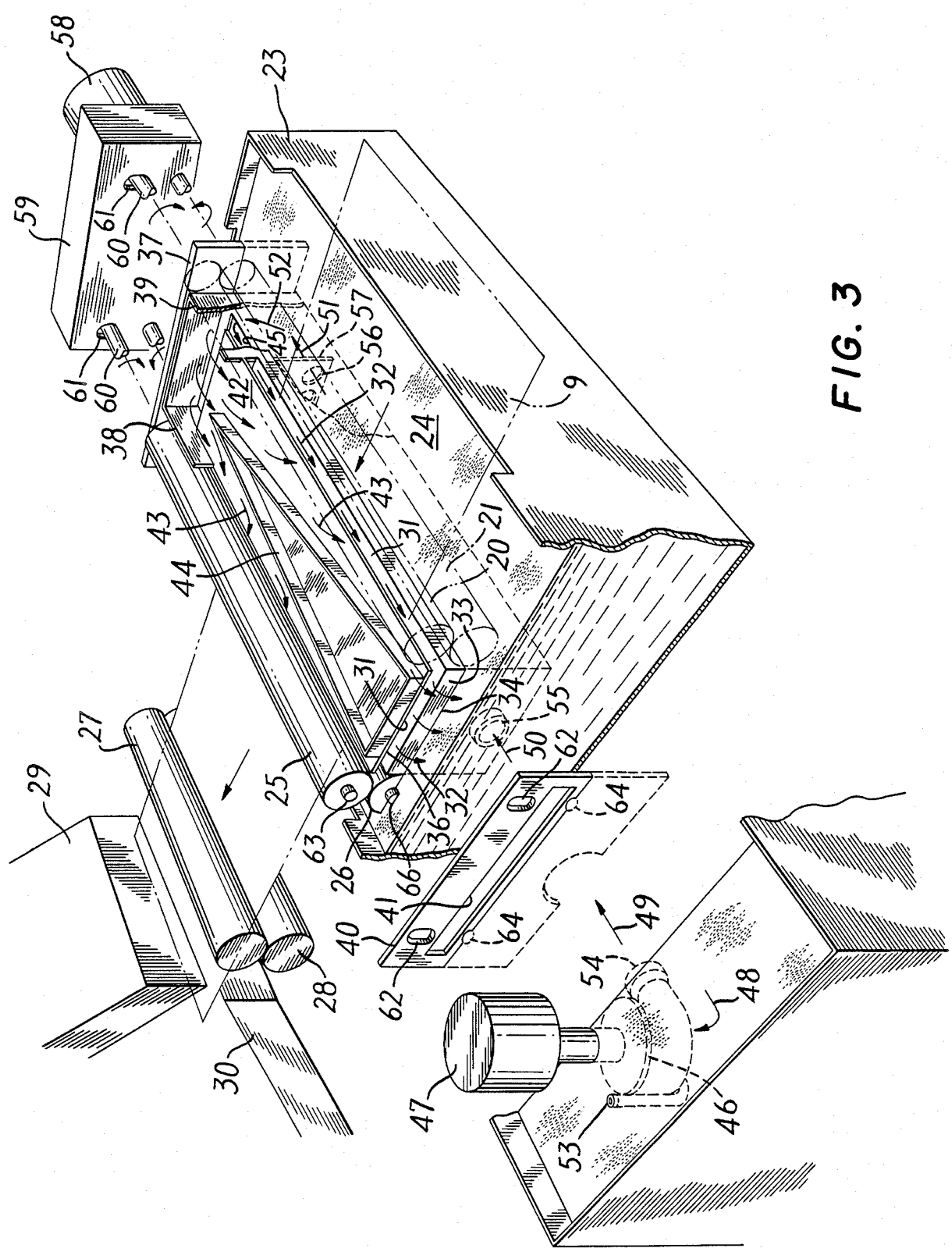
FIG. 3 is a perspective view of the inventive apparatus shown in FIG. 1 with the cabinet covers removed and partially in exploded form to illustrate the invention with greater clarity.

Referring to the invention in greater detail with reference to FIG. 1, a desk-like unit 10 conveniently houses the several components of the invention. An entrance slot 11 for printed circuits to be soldered leads to horizontally arranged rolls, described in detail hereinafter, protected by removable covers. A cabinet 12 suitably accessible through doors, covers and the like houses the required power components for heating the solder, providing heated pressurized air for air knives, and other necessary elements. A control panel 13, behind plate 13a (FIG. 2), carries controls for solder pot temperature, air heater temperature, on and off motor controls for the rolls, speed controls for the motor, air ventilation controls and other necessary switches, gauges and the like. A removable hood 14 and plenum 15 is suitably coupled at exit 16 to an exhaust line (not shown) to ventilate the apparatus properly. An exit slot 17 leading from the horizontal rolls is provided for the soldered and leveled printed circuits.

Referring next to FIGS. 3 and 4, a pair of rolls 20 and 21, shown in phantom in FIG. 3 for purposes of clarity, serve to convey printed circuit panels horizontally across a container 23 filled with molten solder 24. Suitable heaters in the walls, bottom, or both, of the container 23, and suitable temperature sensors, are used to maintain the solder 24 at a desired temperature, ordinarily at least 100° F. above its melting point. A temperature of about 500° F. has been found satisfactory. If needed, additional transport rolls or other conveying means may be used to carry printed circuit panels to the input rolls 20 and 21.

Rolls 25 and 26 receive printed circuit panels from the rolls 21 and 22 and convey them to transport rolls 27 and 28, preferably not wetted by solder. Titanium rolls have proven satisfactory, and ceramic rolls may also be used. Air knives 29 and 30, located adjacent to the exit of the horizontal roll configuration, receive heated air through conduits from a compressor located in the cabinet 12. The air temperature, pressure and volume for the knives are adjusted by suitable controls in the panel 13. If desired, an additional roll or rolls or other suitable conveyor may be used to transport the printed circuit panel after it has been selectively soldered and leveled.

To apply solder to a printed circuit which travels along a path delineated by the broken lines 9, a solder conduit or channel 31 is provided along which molten solder flows, as shown by arrows 32. The channel 31 is formed by the pair of rolls 20, 21, the pair of rolls 25, 26, a top 33 on a supply plenum 34, and an upper plate 36. A support plate 37 at the inlet side of the solder conduit supports the rolls 20, 21 and 25, 26, and is mounted on the plenum 34. Plates 38 and 39 extend a short distance along the rolls to confine the initial solder flow. A support plate 40 attached to the other end of the plenum holds the rolls 20, 21 and 25, 26 and includes a slot 41, permitting exit of the molten solder from the solder conduit 31.

An upper level solder channel 42 along which solder flows, as shown by arrows 43, is formed by the upper surface of the plate 36. Solder flow is controlled by a diversion wedge 44. Solder pumped through an opening 45 in the upper surface of the plenum chamber, at its end, flows into the solder conduit 31, with overflow solder passing along the upper solder path 42.

A solder pump 46, immersed in the molten solder and driven by a motor 47 includes a pump output 54 connected to a plenum chamber input 55. The molten solder 24 is pumped through the inlet 55 and the plenum chamber 34 through a perforated baffle formed by openings 56 in a wall 57 at the end of the chamber. The baffle is for the purpose of stabilizing the solder flow. An arrow 48 indicates solder entering the pump and arrows 49, 50, 51 and 52 show the flow of pumped solder through the plenum to the opening 45 for distribution of the solder above the plenum in the channel 31 with overflow to the path 42.

A tube 53 connected to the pump 46 has an input above the molten solder level and below an oil level, as will be explained hereinafter.

A motor 58 drives a suitable gear train mounted in a drive housing 59. Shafts 60 extend from the housing to the rolls 20, 21, 25 and 26. The rolls 20, 21; 25, 26, and 27, 28 are mounted to accommodate printed circuits having various thicknesses. As shown, U-shaped slots 61 and universal drive couplings to the upper shafts 60 provide for free upward vertical movement of the upper rolls 20 and 25. At the other end of the rolls, U-shaped slots 62 journal shafts 63 of the upper rolls 20 and 25, and openings 64 journal shafts 66 of the lower rolls.

Suitable drive and mounting means (not shown) are also provided for the rolls 27 and 28, and permit accommodation of printed circuit boards having various thicknesses.

As shown, the roll configuration does not require flexing of the printed circuit panels passed therethrough. Thus both so-called rigid and flexible substrate printed circuit panels can be processed. Of course, it is understood that the terms "rigid" and "flexible" in this context are relative. Rigidity or stiffness is function of cross sectional dimensions, number of different layers within the cross-section, and the mechanical and thermal properties of the materials used. Thick substrates develop greater internal stresses in bending and, likewise, require greater forces for bending. The danger of internal damage or permanent deformation makes bending thick substrates undesirable. On the other hand, thin flexible printed circuit panels have little resistance to outside forces and are, therefore, more difficult to handle in general terms. This embodiment of the invention has been designed to process both types of printed circuit panels.

The rolls 20, 21, 25 and 26 should be wetted with molten solder to insure proper operation of the apparatus. For example, nickel rolls have been found satisfactory in use.

The use of wetted rolls 20, 21, 25 and 26, which act as boundaries to the solder conduit or channel 31 and upper solder path 42, prevents adhesion to the rolls of foreign material such as residues of flux or other contaminants. Any that do linger are easily washed away by the constant flow of fresh solder brought up from the molten solder by the partially immersed lower rolls 21 and 26 and the solder flowing in the conduits 31 and 42. Nickel and high-nickel content alloys may be used for the rolls. Pure nickel, in addition to being wetted by molten solder, is an excellent material due to its low solubility with eutectic solder at 500° F.

To understand the soldering process performed by the inventive apparatus, reference is made to FIG. 3 which shows the flow of liquid solder via the arrows identified above. Thus the pump 46 flows solder through the plenum chamber 34 and out the opening 45. The walls 37, 38 and 39 confine the molten solder and cause laminar flow through the channel 31 over the plenum and under the plate 36, the rolls 20, 21 and 25, 26 acting as boundaries for the channel 31. The top plate 36 of the channel 31 also serves the function of limiting flotation of the panels passing through the solder. Some overflow solder passes along the path 42. The solder in the conduit of channel 31 is under slight pressure due to its confinement. The dimensions of the channel 31 are sufficient to permit the unimpaired travel of printed circuit panels therethrough when propelled by the rolls 25, 26 and 27, 28.

With this construction, when no panels are being processed, the solder flows along the conduits 31 and 42. From there it drains back to the solder container, as shown in FIG. 3. The rolls and conduits are preferably slightly off level in a transverse direction with the higher ends of the rolls at the solder input side. The elevation differences are, however, small, to minimize turbulence and thus avoid excessive oxide formation.

Overflow solder from the plenum pumped through the opening 45 drains along the upper surface plate 36 and is directed to the rolls by the diversion wedge 44. This serves to further wet and wash the rolls with solder and prevent contamination. The solder from the channel then flows back to the sump in the container 23.

It has been found desirable to use an oil blanket to prevent oxygen contact with the solder surface in the sump, thus minimizing dross formation. The oil also combines with the oxides formed when the blanket is broken. When injected into the solder flow through the fluid injector 53 of pump 46, it improves heat transfer and reduces surface tension to permit better wetting of the nickel rolls as well as better soldering of the printed circuits. The oil also increases the thermal stability of the flux and other residues arriving in the sump, thus minimizing the formation of solids. The oil improves lubrication of moving parts above and below the solder surface. The preferred oil used is a high temperature fusing oil.

When a printed circuit is to be processed, solder flux is applied to both sides in the normal fashion. It is then fed into the slot 11 to present it to the rolls 20 and 21. The printed circuit then moves through the flowing molten solder in the conduit 31 to the rolls 25 and 26, from whence it is transported to the rolls 27 and 28. The printed circuit panel is then exposed to heated air from the air knife 29, in the case of a thin flexible printed circuit panel, or to both air knives 29 and 30 if thicker, rigid panels are being processed.

Figure 5:
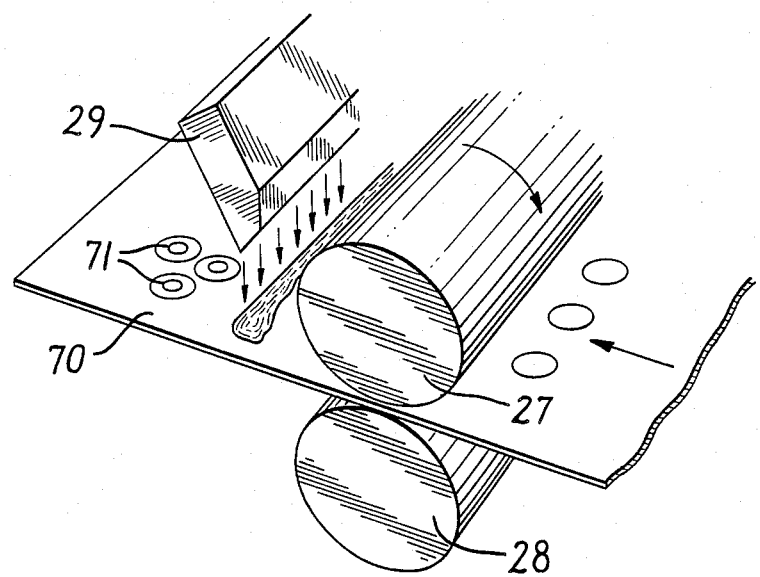
FIG. 5 is an enlarged detail, in perspective of one air knife leveling configuration that can be used in the apparatus of FIGS. 1–4 and 6.

The air knife design is small and simple and does not include heaters in the nozzles. Such heaters require increased size and adversely effect aerodynamics. The size of the air knife is adequate for the effective channeling of hot compressed air and causes a maximum pressure drop to occur at the output orifice. Although solder is rapidly removed by the air jet, minimal spatter occurs. This is to be contrasted with conventional air knives using two opposing nozzles and which heat the air within the knives. It is difficult, with directly opposed nozzles, to achieve dynamic balance. Without it, more solder is forced to and found on one side of the circuit pad than on the other side. Using the single nozzle 29, as shown in FIG. 5, or the offset nozzles 29 and 30, as best shown in FIG. 4, the air line of impingement is not turbulent and causes a wave of solder 29a to form on a printed circuit panel 70 just behind the nip line of the output rolls 27 and 28, which, as previously stated, may be formed of titanium or ceramic non-solder wetting material. Holes 71 (diagrammatically shown) in the panel are effectively cleared of solder by the process.

The use of internal axially located non-rotating heaters in the upper rolls 20 and 25 may be necessary under certain circumstances. However, with the rolls set to contact the lower rolls 22 and 26 that are partially submerged in the molten solder 24, and with a well insulated close fitting cover, heat transfer from the liquid solder will be sufficient to maintain the upper rolls at a suitable temperature. Moreover, selecting proper materials for the upper rolls, i.e., materials having good conductivity, low specific heat and sized properly, will assist in maintaining the rolls at proper temperature. Nevertheless, one or both of the rolls may be heated by internal heaters in a conventional manner if desired for some particular applications.

The temperature of the air jet from the knife 29 or knives 29 and 30, must not freeze the solder. Rather the solder should freeze after surface tension of the liquid has worked to provide a natural smooth appearance. The advantage of the inventive horizontal processing is that so-called solder droop is prevented. Thus gravity causes solder joints to sag on vertical machines but not on the inventive horizontal arrangement.

Location of the air heater in the cabinet 12 is for convenience and safety. Operators are protected from injury and knife maintenance is reduced to infrequent orifice cleaning.

A major advantage afforded by this embodiment of the invention is that only the exposed copper on both sides of the printed circuit is soldered simultaneously with the entire printed circuit substrate subjected to the elevated solder temperature for a very brief time interval. Further advantages include improved control of the soldering and leveling process, ease of integrating the apparatus into a totally automated system, no special fixturing required for processing the printed circuit panels, and much improved utilization of space and energy when compared with prior known soldering and leveling processes.

Figure 6:
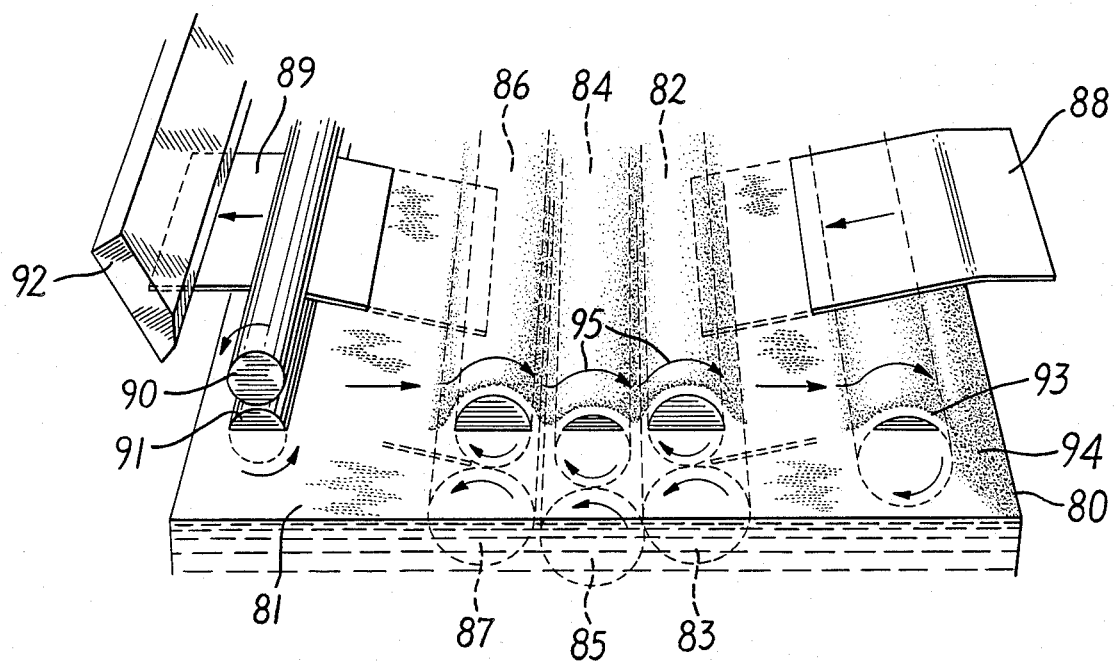
FIG. 6 is a perspective view diagrammatically showing another embodiment of the inventive apparatus for selectively soldering and leveling printed circuit panels.

While the apparatus described in connection with FIGS. 1 through 5 can be used to process both rigid and flexible printed circuits, the apparatus shown in FIG. 6 is for the purpose of selectively soldering and leveling flexible printed circuit panels. It will be understood that the basic cabinet configuration may be similar to that shown in FIG. 1.

Referring more specifically to FIG. 6, which shows diagrammatically another embodiment of the present invention, a configuration 80, provided by a suitable container, of liquid solder 81, is maintained at a suitable temperature by heaters. Three pairs of rolls 82 and 83, 84 and 85, and 86 and 87, are mounted in a horizontal arrangement to transport flexible circuit panels 88 and 89 through the molten solder. A pair of rolls 90 and 91 serve to transport the processed panels out of the apparatus. An air knife 92 at the exit nip of the rolls 90 and 91 is supplied with suitable heated compressed air, as explained in connection with FIGS. 1 through 5. A roll 93 at the input side of the apparatus functions to convey solder surface contamination to a collection area 94.

In the apparatus of FIG. 6, the rolls 83, 85 and 87, totally submerged in the liquid solder 81, are driven using suitable gearing from a motor located in the cabinet. The upper three rolls 82, 84 and 86 are partially submerged in the liquid solder and resiliently positioned by suitable journals in contact with their counterpart lower rolls.

The three upper rolls 82, 84 and 86 serve a dual purpose. The rolls provide tractive forces to convey the printed circuit panels through the liquid solder. In addition, the upper rolls transport surface contamination in the solder towards the roll 93 and collection area 94. The latter function is provided by using rolls machined to a very smooth surface that are wetted by solder. In addition, the rolls should be easily cleaned with acidic material, preferably the flux used on the circuit panels. Nickel rolls have been used satisfactorily. In operation, as indicated by the arrows 95 in FIG. 6, surface contaminates on the solder, such as oxides, are conveyed along the wetted rolls 86, 84, 82 and 93 towards the collection area 94 from which it is readily removed. Additionally the roll 93 functions to keep the entry area clean.

In processing the printed circuit panel 88, it is brushed with flux and then inserted into the nip of rolls 82 and 83 which initiates a continuous linear motion of the panel through the solder rolls 84 and 85 and the exit rolls 86 and 87. The non-wetting rolls 90 and 91, formed for example of titanium, receive the soldered printed circuit panel 89 and the air knife 92 provides for leveling of the solder in the manner illustrated in FIG. 5. It may be desirable to use internal heaters to maintain the temperature of the upper rolls at a proper level, as explained in connection with the rolls of FIG. 2.

The processing apparatus of FIG. 6, as well as FIGS. 1-5, inherently causes the portion of the printed circuit panel that enters the liquid solder first to exit the solder first. Moreover, roll speed is adjustable over wide limits and the solder container capacity and the energy required to heat the solder are low in relation to the throughput capability of the apparatus. Finally, contamination of the solder by the copper being processed is reduced due to the minimum time that the panel is immersed in the solder. Thus solder need be changed much less often than with the use of prior art methods.

Collected oxides may also be removed through use of roll salts which convert the oxides to a sludge. The same salts may be used as a roll cleaning flux. The final rolls 90 and 91, when made of titanium, can be cleaned in water when using water-soluble fluxes, and solvent when using solvent-soluble fluxes on the printed circuits.

While the apparatus and method of the invention have been described in connection with two specific embodiments, it will be understood that other modifications may be made by those skilled in the art and that the invention is defined by the appended claims.

I claim:

1. Apparatus for soldering printed circuit panels comprising a container for molten solder, means for supplying heat to the container to maintain the molten solder at a desired temperature, pairs of input and output rolls mounted in a horizontal configuration for conveying printed circuit panels horizontally across the solder container, means mounting two of the pairs of rolls with the lower rolls having their upper surfaces protruding from the molten solder, means forming a solder conduit between the two pairs of rolls, said forming means including (a) a lower surface extending between the pairs of rolls (b) an upper surface extending between the pairs of rolls and (c) the two pairs of rolls, means for flowing molten solder horizontally along the conduit whereby printed circuit panels conveyed through the horizontal roll configuration pass through the horizontal flow of molten solder, the upper surface restricting flotation of the printed circuit panels by the molten solder.

2. Apparatus as defined in claim 1, in which air knife means are located at the output side of the roll configuration to level the molten solder on the printed circuit panels by removing excess amounts of the solder as the panels exit from the roll configuration.

3. Apparatus for soldering printed circuit panels comprising a container for molten solder, means for supplying heat to the container to maintain the molten solder at a desired temperature, pairs of rolls mounted in a horizontal configuration for conveying printed circuit panels horizontally across the solder container, means mounting two of the pairs of rolls with the lower rolls having their upper surfaces protruding from the molten solder, means forming a solder conduit between the two pairs of rolls, said forming means including (a) a lower surface extending between the pairs of rolls, (b) an upper surface extending between the pairs of rolls and (c) the two pairs of rolls, means in the container for pumping solder from the container to one end of the conduit, a drain at the other end of the conduit for returning solder to the container to provide a flow of solder horizontally through the conduit, whereby printed circuit panels conveyed through the horizontal roll configuration pass through the horizontal flow of the molten solder, the upper surface restricting flotation of the printed circuit panels by the molten solder.

4. Apparatus as defined in claim 3, in which air knife means are located at the output side of the roll configuration to level the molten solder on the printed circuit panels by removing excess amounts of the solder as the panels exit from the roll configuration.

5. Apparatus as defined in claim 4, wherein the air knife means includes a single air knife acting on one side of the printed circuit panels.

6. Apparatus as defined in claim 5, wherein the air knife means includes a pair of offset air knives acting on both sides of the printed circuit panels.

7. Apparatus for soldering printed circuit panels comprising a container for molten solder, means for supplying heat to the container to maintain the molten solder at a desired temperature, pairs of rolls mounted in a horizontal configuration for conveying printed circuit panels horizontally across the solder container, means mounting two of the pairs of rolls with the lower rolls having their upper surfaces protruding from the molten solder, means forming a solder conduit between the two pairs of rolls, said forming means including (a) a lower surface extending between the pairs of rolls, (b) an upper surface formed by a plate extending between the pairs of rolls and (c) the two pairs of rolls, means forming an additional flow path for solder above the solder conduit on the plate extending between the pairs of rolls to wet and wash the rolls with solder and prevent contamination, means in the container for pumping solder from the container to one end of the conduit and one end of the additional flow path, drains at the other ends of the conduit and the additional flow path for returning solder to the container to provide flows of solder horizontally through the conduit and along the path, whereby printed circuit panels conveyed through the horizontal roll configuration pass through the horizontal flow of molten solder, the plate restricting flotation of the printed circuit panels by the molten solder.

8. Apparatus as defined in claim 7, in which air knife means are located at the output side of the roll configuration to level the molten solder on the printed circuit panels by removing excess amounts of solder as the panels exit from the roll configuration.

9. Apparatus as defined in claim 8, wherein the air knife means includes a single air knife acting on one side of the printed circuit panels.

10. Apparatus as defined in claim 9, wherein the air knife means includes a pair of offset air knives acting on both sides of the printed circuit panels.

11. Apparatus as defined in claim 8, 9 or 10, in which the horizontal configuration of rolls includes a pair of rolls to convey the printed circuit panels from the output rolls to the air knife means.

* * * * *